(12) United States Patent
Braun et al.

(10) Patent No.: US 7,405,591 B2
(45) Date of Patent: Jul. 29, 2008

(54) CONCEPT FOR INTERFACING A FIRST CIRCUIT REQUIRING A FIRST SUPPLY VOLTAGE AND A SECOND SUPPLY CIRCUIT REQUIRING A SECOND SUPPLY VOLTAGE

(75) Inventors: Georg Braun, Holzkirchen (DE); Dirk Scheideler, Munich (DE); Steve Wood, Munich (DE); Richard Johannes Luyken, Munich (DE); Edoardo Prete, Munich (DE); Hans-Peter Trost, Munich (DE); Anthony Sanders, Haar (DE)

(73) Assignee: Qimonda AG, Munich (DE)

( * ) Notice: Subject to any disclaimer, the term of this patent is extended or adjusted under 35 U.S.C. 154(b) by 0 days.

(21) Appl. No.: 11/641,545

(22) Filed: Dec. 19, 2006

(65) Prior Publication Data

US 2008/0143386 A1   Jun. 19, 2008

(51) Int. Cl.
*H03K 19/0175* (2006.01)
(52) U.S. Cl. .............................. 326/80; 326/21; 326/68
(58) Field of Classification Search .................. 326/21, 326/31, 80–81, 63, 68
See application file for complete search history.

(56) References Cited

U.S. PATENT DOCUMENTS

| | | | | |
|---|---|---|---|---|
| 5,534,812 A | * | 7/1996 | Cao et al. | 327/333 |
| 6,573,753 B1 | * | 6/2003 | Snyder | 326/87 |
| 7,321,240 B2 | * | 1/2008 | Schaefer | 326/82 |

* cited by examiner

*Primary Examiner*—James H Cho
(74) *Attorney, Agent, or Firm*—Slater & Matsil, L.L.P.

(57) ABSTRACT

An apparatus interfaces a first circuit using a first supply voltage and a second circuit using a second supply voltage different from the first supply voltage. The apparatus includes a driver circuit having a driver network comprising driver supply voltage terminals connected to controllable switches. The controllable switches include resistive elements or are separated from resistive elements. A receiver circuit has a receiving network comprising a resistive element and receiver supply voltage terminals and a connection line connecting the driver circuit and the receiving circuit. The controllable switches have two switch configurations, a first switch configuration resulting in a high voltage on the connection line and a second switch configuration resulting in a low voltage on the connection line.

33 Claims, 6 Drawing Sheets

IO_SCHEMATIC_HTT

Table 1
Settings and Values:
- $VDDQ_{Drv} = 1.20\,V \pm 20$
- $VDDQ_{Rcv} = 1.80\,V \pm 20$
- $VSSQ_{Drv} = VSSQ_{Rcv} = 0\,V$
- $RON_{DrvUp} = 20\ \pm 20$
- $RON_{DrvDn} = 20\ \pm 20$
- $RTT_{Up}\ = 60\ \pm 20$
- $RTT_{Dn}\ =$ infinite
- $V_{hi}\ = 1.35\,V$
- $V_{lo}\ = 0.45\,V$
- $V_{ref}\ = 0.90\,V$ Table 2
Settings and Values:
- $VDDQ_{Drv} = 1.20\,V \pm 20$
- $VDDQ_{Rcv} = 1.80\,V \pm 20$
- $VSSQ_{Drv} = VSSQ_{Rcv} = 0\,V$
- $RON_{DrvUp} = 44\ \pm 20$
- $RON_{DrvDn} = 20\ \pm 20$
- $RTT_{Up}\ = 75\ \pm 20$
- $RTT_{Dn}\ =$ infinite
- $V_{hi}\ = 1.42\,V$
- $V_{lo}\ = 0.38\,V$
- $V_{ref}\ = 0.90\,V$

IO_SCHEMATIC_HTT

Table 1

Settings and Values:

- $VDDQ_{Drv}$ = 1.20 V ± 20
- $VDDQ_{Rcv}$ = 1.80 V ± 20
- $VSSQ_{Drv}$ = $VSSQ_{Rcv}$ = 0 V
- $RON_{DrvUp}$ = 20 ± 20
- $RON_{DrvDn}$ = 20 ± 20
- $RTT_{Up}$ = 60 ± 20
- $RTT_{Dn}$ = infinite
- $V_{hi}$ = 1.35 V
- $V_{lo}$ = 0.45 V
- $V_{ref}$ = 0.90 V Table 2

Settings and Values:

- $VDDQ_{Drv}$ = 1.20 V ± 20
- $VDDQ_{Rcv}$ = 1.80 V ± 20
- $VSSQ_{Drv}$ = $VSSQ_{Rcv}$ = 0 V
- $RON_{DrvUp}$ = 44 ± 20
- $RON_{DrvDn}$ = 20 ± 20
- $RTT_{Up}$ = 75 ± 20
- $RTT_{Dn}$ = infinite
- $V_{hi}$ = 1.42 V
- $V_{lo}$ = 0.38 V
- $V_{ref}$ = 0.90 V

FIG 5

Table 3

Settings and Values:

- $VDDQ_{Drv} = 1.20\ V \pm 20$
- $VDDQ_{Rcv} = 1.80\ V \pm 20$
- $VSSQ_{Drv} = VSSQ_{Rcv} = 0\ V$
- $RON_{DrvUp} = 20\ \pm 20$
- $RON_{DrvDn} = 20\ \pm 20$
- $RTT_{Up}\ \ = 50\ \pm 20$
- $RTT_{Dn}\ \ = 300\ \pm 20$
- $V_{hi}\ \ \ = 1.31\ V$
- $V_{lo}\ \ \ = 0.49\ V$
- $V_{ref}\ \ = 0.90\ V$ Table 4

Settings and Values:

- $VDDQ_{Drv} = 1.80\ V \pm 20$
- $VDDQ_{Rcv} = 1.20\ V \pm 20$
- $VSSQ_{Drv} = VSSQ_{Rcv} = 0\ V$
- $RON_{DrvUp} = 30\ \pm 20$
- $RON_{DrvDn} = 30\ \pm 20$
- $RTT_{Up}\ \ = 240\ \pm 20$
- $RTT_{Dn}\ \ = 48\ \pm 20$
- $V_{hi}\ \ \ = 1.11\ V$
- $V_{lo}\ \ \ = 0.09\ V$
- $V_{ref}\ \ = 0.60\ V$

FIG 6

Table 5

Settings and Values:
- $VDDQ_{Drv} = 1.80$ V
- $VDDQ_{Rcv} = 1.20$ V
- $VSSQ_{Drv} = VSSQ_{Rcv} = 0$ V
- $RON_{DrvUp} = 20$
- $RON_{DrvDn} = 20$
- $RTT_{Up} = $ infinite
- $RTT_{Dn} = 40$
- $V_{hi} = 1.20$ V
- $V_{lo} = 0.00$ V
- $V_{ref} = 0.60$ V Table 6

Settings and Values:
- $VDDQ_{Drv} = 1.80$ V
- $VDDQ_{Rcv} = 1.20$ V
- $VSSQ_{Drv} = VSSQ_{Rcv} = 0$ V
- $RON_{DrvUp} = 25$
- $RON_{DrvDn} = 20$
- $RTT_{Up} = $ infinite
- $RTT_{Dn} = 50$
- $V_{hi} = 1.20$ V
- $V_{lo} = 0.00$ V
- $V_{ref} = 0.60$ V

CONCEPT FOR INTERFACING A FIRST CIRCUIT REQUIRING A FIRST SUPPLY VOLTAGE AND A SECOND SUPPLY CIRCUIT REQUIRING A SECOND SUPPLY VOLTAGE

TECHNICAL FIELD

The present invention relates to a concept for interfacing a first electrical circuit requiring a first supply voltage and a second electrical circuit requiring a second supply voltage different from the first supply voltage, which, in particular, can be used to interface a memory controller or a memory buffer chip with memory devices.

BACKGROUND

Pull-up and pull-down impedances are commonly used at an interface between two different types of logic devices, possibly operating at different power supply voltages. For example, in DDR2-SDRAM systems (DDR=Double Data Rate, SDRAM=Synchronous Dynamic Random Access Memory) center tapped driver pull-up and pull-down impedances in a driver circuit are usually kept equal or symmetric, as well as termination pull-up and pull-down impedances in a termination circuit. In case of a memory write operation, usually the memory controller or memory buffer makes use of a driver network to drive data towards a memory device and the memory device receives the data with a receiver or termination network. For a memory read operation the functionalities are vice versa. With that setup, a resulting common mode voltage at a receiving terminal fits to a target input reference voltage $V_{ref}$, which is typically half the supply voltage of the receiving circuit.

In GDDR4-SGRAM systems (GDDR4=Graphics Double Data Rate (Version 4), SGRAM=Synchronous Graphics Random Access Memory) the setup of driver pull-up and pull-down impedances and termination impedances is implemented asymmetrically on the driver and asymmetrically at the receiver, however requiring equal supply voltage values for both, the driving circuit and the receiving circuit.

For a reduced power dissipation, it is desirable to further reduce the supply voltage on the memory controller or the memory buffer chip, like an advanced memory buffer (AMB), while keeping a higher supply voltage on the memory components.

SUMMARY OF THE INVENTION

In accordance with embodiments, the present invention provides an apparatus for interfacing a first circuit requiring a first supply voltage and a second circuit requiring a second supply voltage different from the first supply voltage, the apparatus comprising a driver circuit having a driver network comprising driver supply voltage terminals connected to controllable switches, the controllable switches comprising resistive elements or being separated from resistive elements, a receiver circuit having a receiving network comprising a resistive element and receiver supply voltage terminals and a connection line connecting the driver circuit and the receiving circuit, wherein the controllable switches have two switch configurations, a first switch configuration resulting in a high voltage on the connection line and a second switch configuration resulting in a low voltage on the connection line, wherein the resistive elements in the driver network and the receiver network have values so that a sum of the high voltage and the low voltage is equal to the second supply voltage within a range of 10% of the second supply voltage when the first supply voltage is applied to the driver supply voltage terminals and when the second supply voltage is applied to the receiver supply voltage terminals.

In a further aspect, the present invention is providing a system comprising a first circuit having a first voltage supply for supplying a first supply voltage, a second circuit having a second voltage supply for supplying a second supply voltage being different from the first supply voltage and an interface interfacing the first circuit and the second circuit, the interface comprising a driver circuit having a driver network comprising resistive elements and driver supply voltage terminals connected to controllable switches, a receiver circuit having a receiving network comprising a resistive element and receiver supply voltage terminals, a connection line connecting the driver circuit and the receiver circuit, wherein the controllable switches have two switch configurations, a first switch configuration resulting in a high voltage on the connection line and a second switch configuration resulting in a low voltage on the connection line, wherein the resistive elements in the driver network and the receiver network are designed to have values so that a sum of the high voltage and the low voltage is equal to the second supply voltage within a range of 10% of the second supply voltage when the first supply voltage is applied to the driver supply voltage terminals and when the second supply voltage is applied to the receiver supply voltage terminals.

In yet a further aspect the present invention is providing a method for interfacing a first circuit using a first supply voltage and a second circuit requiring a second supply voltage different from the first supply voltage, the method comprising a step of switching controllable switches in a driver circuit having a driver network comprising driver supply voltage terminals connected to controllable switches, the controllable switches comprising resistive elements or being separated from resistive elements, the switches having two switch configurations, a first switch configuration resulting in a high voltage on a connection line connecting the driver circuit and a receiver circuit having a receiver network comprising a resistive element and receiver supply voltage terminals, and a second switch configuration resulting in a low voltage on the connection line, wherein resistive elements in the driver network and the receiver network are designed to have values so that a sum of the high voltage and the low voltage is equal to the second supply voltage within a range of 10% of the second supply voltage when the first supply voltage is applied to the driver supply voltage terminals and when the second supply voltage is applied to the second supply voltage terminals.

BRIEF DESCRIPTION OF THE DRAWINGS

In the following, preferred embodiments of the present invention will be described with respect to the accompanying drawings, in which.

DETAILED DESCRIPTION OF ILLUSTRATIVE EMBODIMENTS

Figure 1:
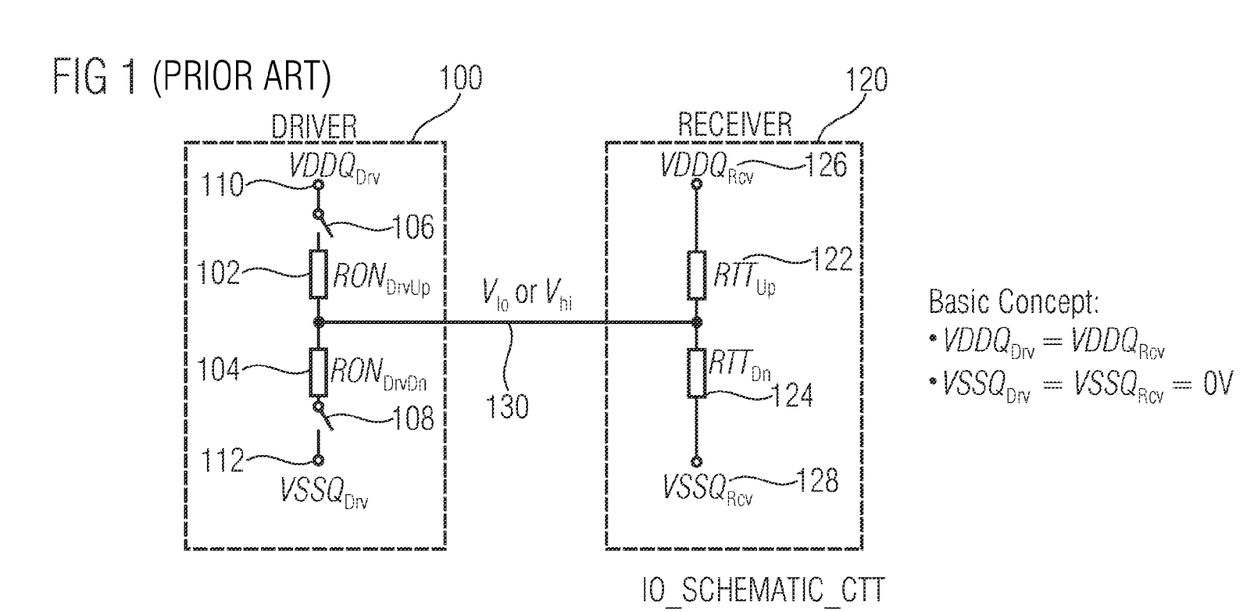
FIG. 1 shows a principle circuit-schematic of a conventional DDR2-SDRAM interfacing a memory controller or buffer chip, both with center-tapped termination and with same supply voltage.
Figure 2:
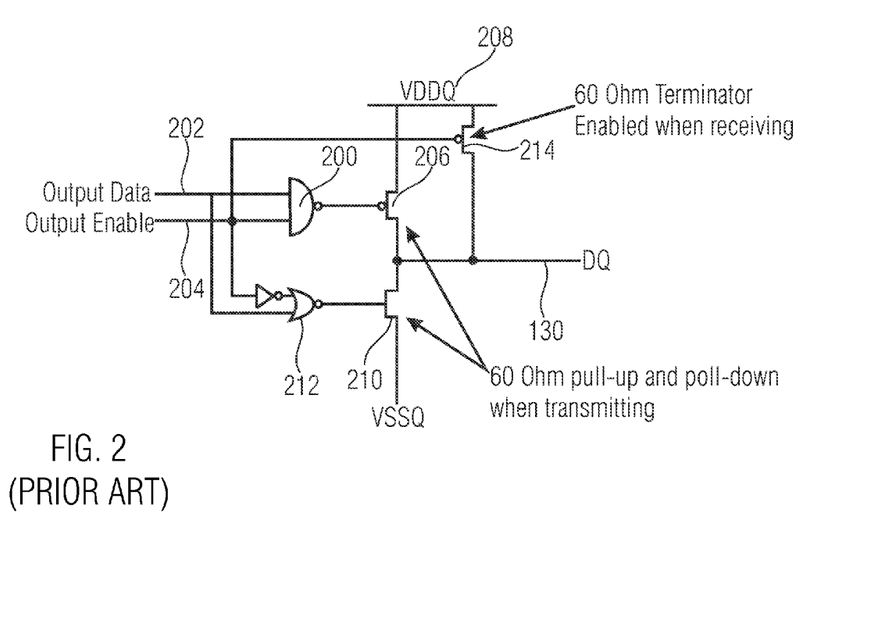
FIG. 2 shows driver and termination pull-up and pull-down impedance concepts in a conventional GDDR4-SGRAM system.

Before the concept and the embodiments of the present invention are described in more detail referring to FIGS. 3 to 6, conventional concepts for interfacing a first electrical circuit and a second electrical circuit both requiring or using the same supply voltage are explained, referring to FIGS. 1 and 2.

FIG. 1 shows a driver circuit 100 having a driver network comprising a first resistive element $RON_{DrvUp}$ 102 and a second resistive element $RON_{DrvDn}$ 104. Further, the driver network 100 comprises a first controllable switch 106 and a second controllable switch 108, the controllable switches being connected to supply voltage terminals $VDDQ_{Drv}$ 110 and $VSSQ_{Drv}$ 112. FIG. 1 further shows a receiver circuit 120 having a receiver network comprising a third resistive element $RTT_{up}$ 122 and a fourth resistive element $RTT_{Dn}$ 124, the resistive elements 122 and 124 being connected to receiver supply voltage terminals $VDDQ_{Rcv}$ 126 and $VSSQ_{Rcv}$ 128. The driver circuit 100 and the receiver circuit 120 are connected by a connection line 130.

The first resistive element $RON_{DrvUp}$ 102 of the driver circuit 100 is connected between the connection line 130 and a first terminal of the first controllable switch 106, the switch 106 being connected to the first supply voltage $VDDQ_{Drv}$ 110 with a second terminal. The second resistive element $RON_{DrvDn}$ 104 of the driver circuit is connected between the connection line 130 and a first terminal of the second controllable switch 108, the second switch 108 being connected to a first reference potential $VSSQ_{Drv}$ 112 with a second terminal. Thereby, the first reference potential $VSSQ_{Drv}$ 112 may, e.g., equal a ground potential. The third resistive element $RTT_{Up}$ 122 of the receiver network 120 is connected between the connection line 130 and the second supply voltage $VDDQ_{Rcv}$ 126. The fourth resistive element $RTT_{Dn}$ 124 of the receiver network 120 is connected between the connection line 130 and a second reference potential $VSSQ_{Rcv}$ 128. The second reference potential $VSSQ_{Rcv}$ 128 may also be equal to the ground potential.

The way the connection line 130 is connected between the resistive elements $RTT_{Up}$ 122 and $RTT_{Dn}$ 124 is commonly referred to as center-tapped termination.

The driver network 100 and the receiver network 120 together with the connection line 130 are, for instance, used in memory systems comprising DDR2-SDRAM memory chips and a memory controller or buffer chip, both supplied with the same supply voltage, i.e., $VDDQ_{Drv}=VDDQ_{Rcv}$. As aforementioned, the first reference potential $VSSQ_{Drv}$ 112 and the second reference potential $VSSQ_{Rcv}$ 128 may correspond to the ground potential GND in such memory systems. For this reason, in DDR2-SDRAM systems, the driver pull-up impedance $RON_{DrvUp}$ 102 and driver pull-down impedance $RON_{DrvDn}$ 104 are kept equal as well as the termination pull-up impedance $RTT_{up}$ 122 and the termination pull-down impedance $RTT_{Dn}$ 124, respectively. With this setup, the resulting common mode voltage obtained on the connection line 130 on the receiver side fits to a target reference voltage $V_{ref}$, which is half the supply voltage $VDDQ_{Rcv}$ 126 of the receiver circuit 120.

In GDDR4-SGRAM systems, within the individual chips, i.e., the memory chips and the memory controller or buffer chip, different driver pull-up and pull-down impedances are used. This is shown on the left of FIG. 2.

The left of FIG. 2 shows circuit schematic of a driver 180 with $RON_{DrvUp}$ and $RON_{DrvDn}$ and a receiving or terminating side 190 with one, two or four receivers, each one having an $RTT_{up}$ and the overall $RTT_{up}$ being equal to 60 Ohm. The circuit shown on the left of FIG. 2 can be used for GDDR4-SGRAM systems. Also, in a GDDR4-SGRAM system, a termination is implemented asymmetrically. That is, there are only termination resistors connected to a positive supply voltage VDDQ.

A block diagram of a circuit working as a driver network as well as a receiver network is depicted on the right of FIG. 2.

The right of FIG. 2 shows a circuit comprising a NAND gate 200, which has its inputs connected to an output data signal 202 and an output enable signal 204. The inverted output of the NAND gate 200 is connected to a control terminal of a PMOS-transistor 206 being connected to a supply voltage VDDQ 208 with its source terminal and being connected to a connection line 130 with its drain terminal. The drain terminal of the PMOS-transistor 206 is also connected to a drain terminal of a NMOS-transistor 210 being connected to a reference potential VSSQ with its source terminal. The control terminal of the NMOS-transistor 210 is connected to the output of a NOR gate 212 having as a first input the data signal 202 and as a second input the inverted enable signal 204. The enable signal 204 forms an input to a further PMOS-transistor 214 being connected to the supply voltage VDDQ 208 with its source terminal and being connected to the connection line 130 with its drain terminal.

As can be seen on the right of FIG. 2, the depicted circuit functions as a driver circuit if the output enable signal 204 is set to logical "high", wherein resistive elements of the driver network and controllable switches are implemented by the transistors 206 and 210. The values of the resistive elements are formed by the On-resistances of the transistors 206 and 210. In the depicted case on the right of FIG. 2, the PMOS-transistor 206 has an On-resistance of 60 Ohm forming a pull-up resistance $RON_{DrvUp}$, while the NMOS transistor 210 has an On-resistance of 40 Ohm forming a pull-down resistance $RON_{DrvDn}$.

In case the output enable signal 204 is put to logical "low", the two transistors 206 and 210 are disabled while the PMOS transistor 214 is enabled, i.e. switched in an "ON"-state. In this case the depicted circuit on the right of FIG. 2 is working as a receiving network with a pull-up resistor $RTT_{Up}$ formed by the On-resistance of the transistor 214, being connected between the connection line 130 and the positive supply voltage VDDQ 208.

The setup depicted in FIG. 2 is implemented for both, the driver as well as the receiver in GDDR4-SGRAM systems. The driver and the receiver network both require equal supply voltage values VDDQ. For the receiver a special reference voltage level is required which is not 0.5*VDDQ but 0.5*VDDQ*(1+40/(40+60))=0.7*VDDQ.

As has been explained referring to FIGS. 1 and 2, current memory systems require the same supply voltage on a memory controller or a buffer chip (like an AMB, AMB=Advanced Memory Buffer) and memory components. To be able to significantly reduce power dissipation, the supply voltage on the memory controller or buffer chip could be reduced while keeping the higher supply voltage on the memory components.

In accordance with the present invention, the reduction of the supply voltage on the memory controller or the buffer chip can be achieved by an asymmetric setup of the pull-up and pull-down resistances of a driver network and a receiver network.

In accordance with an aspect of the present invention, an apparatus for interfacing a first circuit using a first supply voltage and a second circuit using a second supply voltage, different from the first supply voltage, is provided. According to embodiments the apparatus comprises a driver circuit having a driver network comprising driver supply voltage terminals connected to controllable switches, the controllable switches comprising resistive elements for being separated from resistive elements. The apparatus further comprises a receiver circuit having a receiver network comprising a resistive element and receiver supply voltage terminals, as well as a connection line connecting the driver circuit and the receiving circuit, wherein the controllable switches have two switch configurations, a first switch configuration resulting in a high voltage on the connection line and a second switch configuration resulting in a low voltage on the connection line, wherein the resistive elements in the driver network and the receiver network have values so that a sum of the high voltage and the low voltage is equal to the second supply voltage within a range of 10% of the second supply voltage when the first supply voltage is applied to the driver supply voltage terminals and when the second supply voltage is supplied to the driver supply voltage terminals and when the second supply voltage is applied to the receiver supply voltage terminals.

Figure 3:
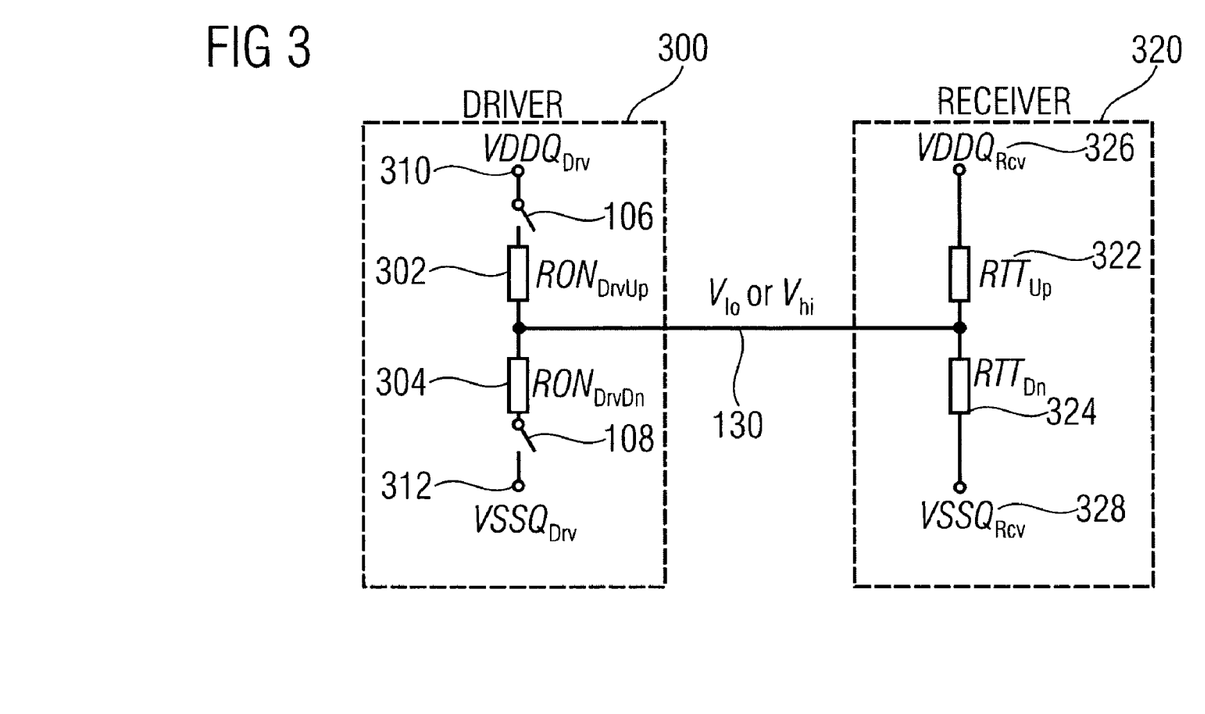
FIG. 3 shows a circuit diagram of an interface between a first circuit using a first supply voltage and a second circuit requiring a second supply voltage, different from the first supply voltage, according to an embodiment of the present invention.

FIG. 3 shows a driver network 300 and a receiver network 320 connected by a connection line 130 according to an embodiment of the present invention.

As well as the circuit depicted in FIG. 1, the driver network 300 comprises a first resistive element $RON_{DrvUp}$ 302 serving as a pull-up impedance and a second resistive element $RON_{DrvDn}$ 304 serving as a pull-down impedance. As already explained referring to FIG. 1, the first resistive element $RON_{DrvUp}$ 302 and the second resistive element $RON_{DrvDn}$ 304 are connected to controllable switches 106 and 108. The first controllable switch 106 is being connected to the first supply voltage $VDDQ_{Drv}$ 310. The second controllable switch 108 is connected to a first reference potential $VSSQ_{Drv}$ 312 which could be a ground potential.

According to embodiments of the present invention, the receiver network 320 comprises a third resistive element $RTT_{Up}$ 322 serving as a pull-up impedance and a fourth resistive element $RTT_{Dn}$ 324 serving as a pull-down impedance. As already explained referring to FIG. 1, the third resistive element 322 and the fourth resistive element 324 are connected to a second supply voltage $VDDQ_{Rcv}$ 326 and a second reference potential $VSSQ_{Rcv}$ 328. The driver network 300 and the receiver network 320 are connected by the connection line 130 as already explained referring to FIG. 1.

Regarding the embodiment of the present invention schematically depicted in FIG. 3, it has to be noted, that in contrast to FIG. 1, the first supply voltage $VDDQ_{Drv}$ 310 and the second supply voltage $VDDQ_{Rcv}$ 326 are different from each other. In this context "different" means that the first supply voltage $VDDQ_{Drv}$ 310 and the second supply voltage $VDDQ_{Rcv}$ 326 differ more from each other than the usually present tolerances of e.g. ±5% or ±10%. However, the first reference potential $VSSQ_{Drv}$ 312 and the second reference potential $VSSQ_{Rcv}$ 328 will be, in general, approximately equal. According to embodiments of the present invention, the first reference potential 312 and the second reference potential 328 correspond to the ground potential, respectively. Also, in contrast to a conventional memory interface as depicted in FIG. 1, the inventive concept envisages asymmetric pull-up and pull-down impedance setups for both the driver network 300 and the receiver network 320.

In the following, the term "asymmetric termination towards a supply voltage" has the following two meanings.

Firstly, an impedance $RON_{DrvUp}$ or $RTT_{Up}$ being connected to a supply voltage $VDDQ_{Drv}$ or $VDDQ_{Rcv}$ has a higher or lower impedance than the impedance $RON_{DrvDn}$ or $RTT_{Dn}$ being connected to the reference or ground potential $VSSQ_{Drv}$ or $VSSQ_{Rcv}$. This means that the impedances differ more from each other than the usually present tolerances of, e.g., ±10% or ±20%. Hence, no tolerance-based difference is meant but an intended difference. This setup is also being referred to as "moderately asymmetric".

Secondly, only a single termination impedance being connected to a supply voltage or reference potential is used. No second termination impedance is used in this setup, which will be referenced to as "asymmetric".

When transmitting or driving data from e.g. a memory controller or buffer chip with a low first supply voltage $VDDQ_{Drv}$ 310 to a memory device with a higher second supply voltage $VDDQ_{Rcv}$ 326, a push-pull output driver is used, as indicated by FIG. 3. In order to move a common mode voltage value $V_{ref}$ up to a level which is required by the memory circuit, an asymmetric termination towards the second supply voltage $VDDQ_{Rcv}$ 326 is used on the receiving memory device according to an embodiment of the present invention. The required common mode voltage value $V_{ref}$ is typically half of the memory device's supply voltage $VDDQ_{Rcv}$ 326, i.e. $V_{ref}=VDDQ_{Rcv}/2$.

When transmitting or driving data from a memory device with a higher first supply voltage $VDDQ_{Drv}$ 310 to a memory controller or buffer chip with a lower second supply voltage $VDDQ_{Rcv}$ 326 ($VDDQ_{Drv}>VDDQ_{Rcv}$), also a push-pull output driver is used at the memory device, according to the depicted setup in FIG. 3. In order to move the common mode voltage value $V_{ref}$ down to a level which is required by the receiving memory controller or buffer chip, $V_{ref}$ is typically half of the memory controller or buffer chip's supply voltage, an asymmetric termination towards the ground supply voltage $VSSQ_{Rcv}$ 328 is used on the receiving memory controller or buffer chip.

On the basis of the first supply voltage $VDDQ_{Drv}$ 310 and the second supply voltage $VDDQ_{Rcv}$ 326 being different from each other, the optimisation goal for the impedances for resistive elements 302, 304, 322 and 324 is a common mode voltage $V_{ref}$ equal to approximately half of the receiving circuit's supply voltage $VDDQ_{Rcv}$ 326. The common mode voltage value $V_{ref}$ can be computed according to $$V_{Ref} = \frac{V_{hi} + V_{lo}}{2}, \qquad (1)$$

with $V_{lo}$ and $V_{hi}$ being the voltage levels corresponding to a logical "low" signal and a logical "high" signal on the connection line 130, respectively. Whether a logical low signal or a logical high signal is transmitted, is controlled by the positions of the controllable switches 106 and 108. A logical low signal is transmitted from the driver circuit 300 to the receiver circuit 320 when switch 106 is in "open"-position or high-impedance position and switch 108 is in "closed" position or low-impedance position. Then the low voltage level $V_{lo}$ can be computed according to the following formula:

$$V_{lo} = \frac{VDDQ_{Rcv}RTT_{Dn}RON_{DrvDn} + VSSQ_{Rcv}RTT_{Up}RON_{DrvDn} + VSSQ_{Drv}RTT_{Up}RTT_{Dn}}{RTT_{Dn}RON_{DrvDn} + RTT_{Up}RON_{DrvDn} + RTT_{Up}RTT_{Dn}} \quad (2)$$

In contrast, a logical "high" signal can be transmitted from the driver circuit 300 to the receiver circuit 320 by closing the controllable switch 106 or putting it in low-impedance position and leaving the controllable switch 108 open or putting it in high-impedance position. Then the following voltage level will be apparent on the connection line 130:

$$V_{hi} = \frac{VDDQ_{Rcv}RTT_{Dn}RON_{DrvUp} + VSSQ_{Rcv}RTT_{Up}RON_{DrvUp} + VDDQ_{Drv}RTT_{Up}RTT_{Dn}}{RTT_{Dn}RON_{DrvUp} + RTT_{Up}RON_{DrvUp} + RTT_{Up}RTT_{Dn}} \quad (3)$$

A voltage swing $V_{swing}$ depends on the high voltage and the low voltage according to $$V_{swing} = V_{hi} - V_{lo} \quad (4)$$

According to an embodiment of the present invention, the switches 106 and 108 as well as the pull-up resistive elements 302 and 322 and the pull-down resistive elements 304 and 324 can be implemented by ON-resistances of transistors as described before, referring to FIG. 2. In a typical push-pull driver, each transistor is switched on only when its complement is switched off. This results in two distinct states resulting in a high voltage $V_{hi}$ and a low voltage $V_{lo}$, as described above. In a third state, in which both switches 106 and 108 (in the form of transistors) are left open a voltage level $V_{tri}$ resulting on the connection line 130 can be computed according to $$V_{tri} = VSSQ_{Rcv} + (VDDQ_{Rcv} - VSSQ_{Rcv})\frac{RTT_{Dn}}{RTT_{Up} + RTT_{Dn}} \quad (5)$$

An effective termination resistance of the center-tapped receiver circuit 320 depicted in FIG. 3 can be computed according to $$RTT_{eff} = \frac{RTT_{Up} * RTT_{Dn}}{RTT_{Up} + RTT_{Dn}} \quad (6)$$

As described above, the common mode voltage level $V_{ref}$ can be optimized by an asymmetric termination or a moderate asymmetric termination on the receiving side. Further optimization of the common mode level can be done by additionally using asymmetric or moderate asymmetric push-pull output drivers, e.g., with a high impedance pull-up path and a low impedance pull-down path or vice versa.

The necessary accuracy for the driver and termination impedances or resistive values can be achieved via state-of-the-art calibration methods. As already mentioned before, a resistive element of the driver network and/or the receiver network and a controllable switch can be implemented by a transistor, when the value of the resistive element is the On-resistance of the transistor, according to embodiments of the present invention. The On-resistance is thereby controllable by the current or voltage at the controlling terminal of the transistor controlling the resistance of a drain-source- or a collector-emitter-path.

Of course, the resistive elements of the driver network 300 and/or the receiver network 320 can also be formed by discrete resistors.

If the resistive elements 302 and 304 and the controllable switches 106 and 108 are implemented by transistors, controlling terminals of the transistors are, e.g., being controlled on the basis of a data signal 202 to be transmitted towards the receiver circuit 320 and the data enabling signal 204 enabling a transmission of the data signal 202.

In general, receiver networks according to embodiments of the present invention may also have switches, similar to the switches 106 and 108 of the driver networks, to connect resistances $RTT_{Up}$ or $RTT_{Up}$ to $VDDQ_{Rcv}$ or $VSSQ_{Rcv}$, respectively. In the description of the present invention however, these switches are assumed to be statically in low impedance state while being in receive mode.

In the following, referring to FIGS. 4 to 6, further embodiments of the present invention will be described in detail.

Figure 4:
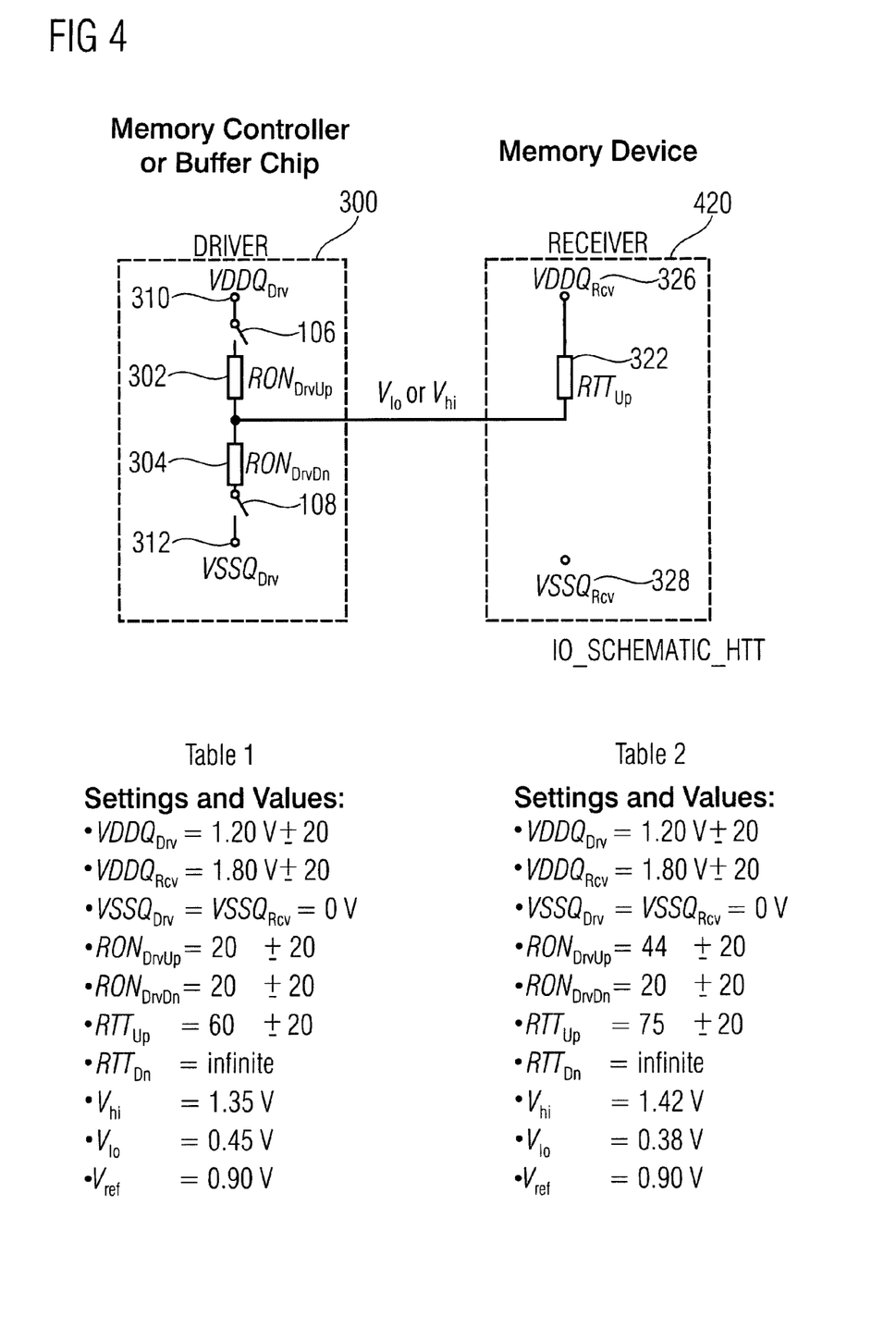
FIG. 4 shows an interface between a memory device and a memory controller or buffer chip with hybrid supply voltage, symmetric push/pull driver and asymmetric termination, according to an embodiment of the present invention.

FIG. 4 shows an apparatus for interfacing a first circuit being a memory controller or a buffer chip requiring a first supply voltage $VDDQ_{Drv}$ 310 and a second circuit being a memory device requiring a second supply voltage $VDDQ_{Rcv}$ 326 different from the first supply voltage $VDDQ_{Drv}$ 310. The apparatus comprises a driver circuit 300 and a receiver circuit 420. According to an embodiment of the present invention, the driver network 300 comprises a first resistive element $RON_{DrvUp}$ 302 being connected between the connection line 130 with a first terminal of a first controllable switch 106, the switch being connected to the first supply voltage $VDDQ_{Drv}$ 310 with a second terminal, and a second resistive element $RON_{DrvDn}$ 304 being connected between the connection line 130 and a first terminal of a second controllable switch 108, the second switch 108 being connected to a ground potential $VSSQ_{Drv}$ 312 with a second terminal. The receiver network 420 comprises a third resistive element $RTT_{Up}$ 322 which is connected between the connection line 130 and the second supply voltage $VDDQ_{Rcv}$ 326.

According to an aspect of the present invention, the first supply voltage $VDDQ_{Drv}$ 310 is smaller than the second supply voltage $VDDQ_{Rcv}$ 326, the resistance of the first resistive element $RON_{DrvUp}$ 302 equals the resistance of the second resistive element $RON_{DrvDn}$ 304 within a range of 10%, preferred within a range of 5% and more preferred within a range of 3% of the resistance of the first resistive element and the receiving network 420 is designed such that the third resistance $RTT_{Up}$ 322 between the connection line 130 and the second supply voltage $VDDQ_{Rcv}$ 326 is smaller than a fourth resistance between the connection line 130 and the ground potential $VSSQ_{Rcv}$ 328. In FIG. 4 the fourth resistance between the connection line 130 and the ground potential $VSSQ_{Rcv}$ 328 is virtually infinity. This embodiment can be seen as a symmetric push/pull driver and asymmetric termination.

Values for the supply voltages $VDDQ_{Drv}$ 310, $VDDQ_{Rcv}$ 326 and the resistive elements $RON_{DrvUp}$ 302, $RON_{DrvDn}$ 304 and $RTT_{Up}$ 322 according to an embodiment of the present invention can be found in the following table.

Setting and Values:

$VDDQ_{Drv}$=1.20 V±20%

$VDDQ_{Rcv}$=1.80 V±20%

$VSSQ_{Drv}$=$VSSQ_{Rcv}$=0 V $RON_{DrvUp}$=20 Ω±20%

$RON_{DrvDn}$=20 Ω±20%

$RTT_{Up}$=60 Ω±20%

$RTT_{Dn}$=infinite

Inserting the nominal values of the supply voltages and the resistive values into the afore-mentioned equations (1) to (3) the high voltage $V_{hi}$, the low voltage $V_{lo}$, in the common mode reference voltage $V_{ref}$ can be computed to $V_{hi}$=1.35 V $V_{lo}$=0.45 V $V_{ref}$=0.90 V.

In a further embodiment of the present invention, the resistance of the first resistive element $RON_{DrvUp}$ 302 is larger than the resistance of the second resistive element $RON_{DrvDn}$ 304. This embodiment can be seen as a moderate asymmetric push/pull driver and asymmetric termination. According to his embodiment of the present invention, the values for the supply voltages and the resistive elements can be found in the following table.

Setting and Values:

$VDDQ_{Drv}$=1.20 V±20%

$VDDQ_{Rcv}$=1.80 V±20%

$VSSQ_{Drv}$=$VSSQ_{Rcv}$=0 V $RON_{DrvUp}$=44 Ω±20%

$RON_{DrvDn}$=20 Ω±20%

$RTT_{Up}$=75±20%

$RTT_{Dn}$=infinite $V_{hi}$=1.42 V $V_{lo}$=0.38 V $V_{ref}$=0.90 V

Figure 5:
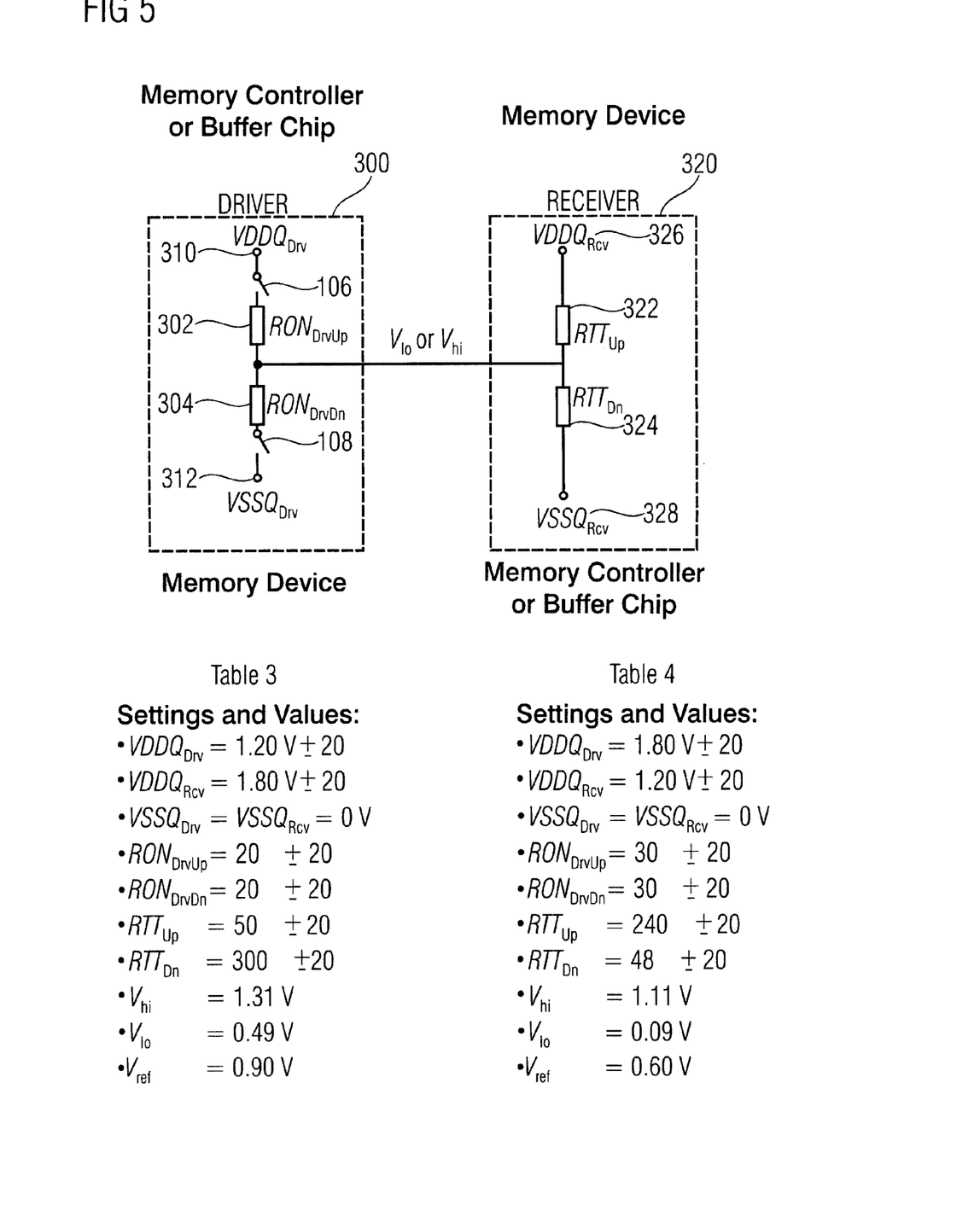
FIG. 5 shows an interface between a memory device and a memory controller or buffer chip with hybrid supply voltage, symmetric push/pull driver and moderate asymmetric termination, according to an embodiment of the present invention.

FIG. 5 shows the circuit-schematic of another embodiment of the present invention.

FIG. 5 shows a memory device and a memory controller or buffer chip with hybrid supply voltage, that is a different supply voltage at the memory device and a memory controller or buffer chip, symmetric push/pull driver and a moderate asymmetric termination.

Hence, FIG. 5 shows, if the memory controller or buffer chip works as a driver, an apparatus wherein the first supply voltage $VDDQ_{Drv}$ 310 is smaller than the second supply voltage $VDDQ_{Rcv}$, the resistance of the first resistive element $RON_{DrvUp}$ 302 equals the resistance of the second resistive element $RON_{DrvDn}$ 304 within a range of 10%, preferred within a range of 5% and more preferred within a range of 3% of the resistance of the first resistive element and the receiving network 320 is designed such that the third resistance $RTT_{Up}$ 322 between the connection line 130 and the second supply voltage $VDDQ_{Rcv}$ 326 is smaller than a fourth resistance $RTT_{Dn}$ 324 between the connection line and the ground potential $VSSQ_{Rcv}$ 328. Possible values according to an embodiment of the present invention can be found in the following table:

Setting and Values:

$VDDQ_{Drv}$=1.20 V±20%

$VDDQ_{Rcv}$=1.80 V±20%

$VSSQ_{Drv}$=$VSSQ_{Rcv}$=0 V $RON_{DrvUp}$=20 Ω±20%

$RON_{DrvDn}$=20 Ω±20%

$RTT_{Up}$=50Ω±20%

$RTT_{Dn}$=300Ω±20%

$V_{hi}$=1.31 V $V_{lo}$=0.49 V $V_{ref}$=0.90 V

According to another aspect of the present invention, if the memory device works as a driver in FIG. 5, the first supply voltage $VDDQ_{Drv}$ 310 is larger than the second supply voltage $VSSQ_{Rcv}$ 326, the resistance of the first resistive element $RON_{DrvUp}$ 302 equals the resistance of the second resistive element $RON_{DrvDn}$ 304 within a range of 10%, preferred within a range of 5% and more preferred within a range of 3% of the resistance of the first resistive element and the receiving network 320 is designed such that the third resistance $RTT_{Up}$ 322 between the connection line 130 and a second supply voltage $VDDQ_{Rcv}$ 326 is larger than the fourth resistance $RTT_{Dn}$ 324 between the connection line 130 and the ground potential $VSSQ_{Rcv}$ 328. Possible values of the supply voltages and the resistive values can be found in the following table:

Setting and Values:

$VDDQ_{Drv}$=1.80 V±20%

$VDDQ_{Rcv}$=1.20 V±20%

$VSSQ_{Drv}$=$VSSQ_{Rcv}$=0 V $RON_{DrvUp}$=30 Ω±20%

$RON_{DrvDn}$=30 Ω±20%

$RTT_{Up}$=240 Ω±20%

$RTT_{Dn}$=48 Ω±20%

$V_{hi}$=1.11V $V_{lo}$=0.09V $V_{ref}$=0.60 V

Figure 6:
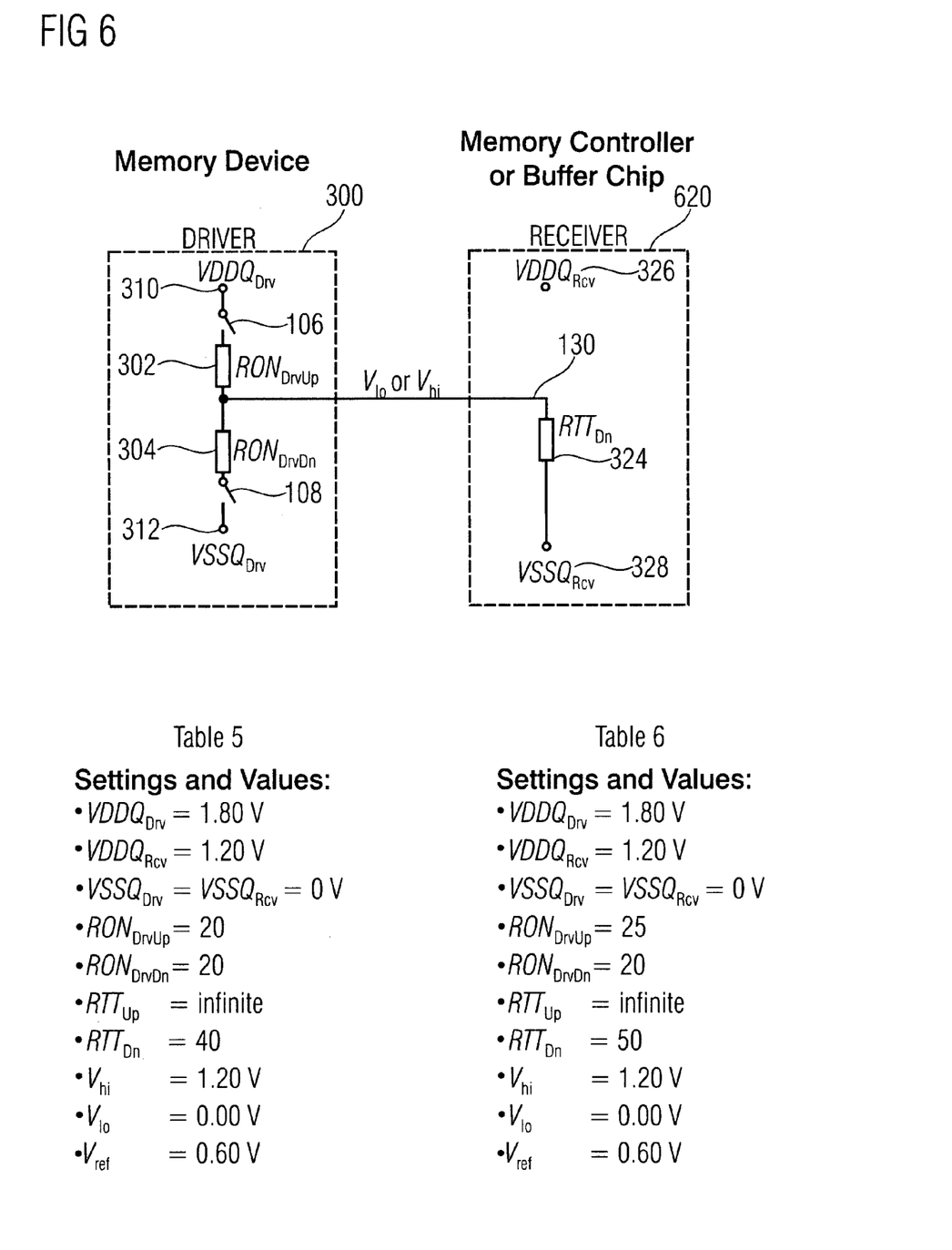
FIG. 6 shows an interface between a memory device and a memory controller or a buffer chip with hybrid supply voltage, symmetric or moderate asymmetric push/pull driver and asymmetric termination, according to an embodiment of the invention.

FIG. 6 shows an embodiment of the present invention, where the third resistive element $RTT_{Up}$ 322 is missing between the connection line 130 and the second supply voltage $VDDQ_{Rcv}$ 326. This means that the resistance of $RTT_{Up}$ is having an infinite value and hence being larger than the fourth resistance $RTT_{Dn}$ 324 being connected between the connection line 130 and the ground potential $VSSQ_{Rcv}$ 328. The configuration depicted in FIG. 6 hence corresponds to a symmetric or a moderate asymmetric push/pull driver and asymmetric termination.

Values for supply voltages and resistive values related to a symmetric push/pull driver according to FIG. 6 are presented in the following table:

Setting and Values:

$VDDQ_{Drv} = 1.80\,V \pm 20\%$ $VDDQ_{Rcv} = 1.20\,V \pm 20\%$ $VSSQ_{Drv} = VSSQ_{Rcv} = 0\,V$ $RON_{DrvUp} = 20\,\Omega \pm 20\%$ $RON_{DrvDn} = 20\,\Omega \pm 20\%$ $RTT_{Up} = \text{infinite}$ $RTT_{Dn} = 40\,\Omega \pm 20\%$ $V_{hi} = 1.20\,V$ $V_{lo} = 0.00\,V$ $V_{ref} = 0.60\,V$ According to yet another aspect of the present invention, the first supply voltage $VDDQ_{Drv}$ 310 is larger than the second supply voltage $VDDQ_{Rcv}$ 326, the resistance of the first resistive element $RON_{DrvUp}$ 302 is larger than the resistance of the second resistive element $RON_{DrvDn}$ 304 and the receiving network 620 is designed such that a third resistance between the connection line 130 and the second supply voltage $VDDQ_{Rcv}$ 326 is larger than the fourth resistance $RTT_{DN}$ 324 between the connection line 130 and the ground potential $VSSQ_{Rcv}$ 328.

Values for supply voltages and resistive values related to this moderate asymmetric push/pull driver according to FIG. 6 are presented in the following table:

Setting and Values:

$VDDQ_{Drv} = 1.80\,V \pm 20\%$ $VDDQ_{Rcv} = 1.20\,V \pm 20\%$ $VSSQ_{Drv} = VSSQ_{Rcv} = 0\,V$ $RON_{DrvUp} = 25\,\Omega \pm 20\%$ $RON_{DrvDn} = 20\,\Omega \pm 20\%$ $RTT_{Up} = \text{infinite}$ $RTT_{Dn} = 50\,\Omega \pm 20\%$ $V_{hi} = 1.20\,V$ $V_{hi} = 1.20\,V$ $V_{ref} = 0.60\,V$ It shall be noted that the presented driver network configurations and receiver network configurations in this disclosure are only examples and by no means constitute a full set of possible configurations for supply voltages and resistive values. According to further embodiments of the present invention also moderate asymmetric push/pull driver and moderate asymmetric termination configurations are possible.

It shall also be noted that both the memory device and the memory controller or buffer chip can serve as driving circuits as well as receiving circuits, depending on whether data is written from a memory controller or buffer chip towards the memory device or data is read from the memory device towards the memory controller or buffer chip. In the first case, the memory controller or buffer chip is on the driving side, whereas in the second case the memory controller or buffer chip is on the receiving side.

The basic concept of the present invention is to compensate asymmetric supply voltage values with asymmetric termination pull-up/pull-down impedances and/or with asymmetric output driver pull-up/pull-down impedances. While maintaining the common mode reference voltage $V_{Ref}$ at the receiving device at the required value $VDDQ_{Rcv}/2$ interface power can be significantly reduced, since e.g. a reduced supply voltage on a memory controller or buffer chip can reduce power. The asymmetric termination resistors have small or even no shoot-through current, hence saving power.

Depending on certain implementation requirements of the inventive methods, the inventive methods can be implemented in hardware or software. The implementation can be performed using a digital storage medium, in particular a disk, a DVD or a CD having electronically readable control signals stored thereon, which cooperate with a programmable computer system such that the inventive methods are performed. Generally, the present invention is, therefore, a computer program product with a program code stored upon a machine-readable carrier, the program code being operative for performing the inventive methods when the computer program product runs on a computer. In other words, the inventive methods are, therefore, a computer program having a program code for performing at least one of the inventive methods when the computer program runs on a computer.

What is claimed is:

1. An apparatus for interfacing a first circuit using a first supply voltage and a second circuit using a second supply voltage different from the first supply voltage, the apparatus comprising:

a driver circuit having a driver network comprising driver supply voltage terminals connected to controllable switches, the controllable switches comprising resistive elements or being separated from resistive elements;

a receiver circuit having a receiving network comprising a resistive element and receiver supply voltage terminals; and a connection line connecting the driver circuit and the receiving circuit, wherein the controllable switches have two switch configurations, a first switch configuration resulting in a high voltage on the connection line and a second switch configuration resulting in a low voltage on the connection line, wherein the resistive elements in the driver network and the receiver network have values so that a sum of the high voltage and the low voltage is equal to the second supply voltage within a range of 10% of the second supply voltage when the first supply voltage is applied to the driver supply voltage terminals, and when the second supply voltage is applied to the receiver supply voltage terminals.

2. The apparatus according to claim 1, wherein a resistive element of the driver network and/or the receiver network and a controllable switch is implemented by a transistor, when a value of the resistive element is an ON-resistance of the transistor.

3. The apparatus according to claim 1, wherein the resistive elements of the driver network and/or the receiver network are formed by resistors.

4. The apparatus according to claim 1, wherein the controllable switches are formed by transistors, wherein controlling terminals of the transistors are controlled on the basis of a data signal to be transmitted towards the receiver circuit and a data enabling signal enabling a transmission of the data signal.

5. The apparatus according to claim 1, wherein the driver network comprises a first resistive element connected between the connection line and a first terminal of a first controllable switch, the switch being connected to the first supply voltage with a second terminal, and a second resistive element being connected between the connection line and a first terminal of a second controllable switch, the second switch being connected to a ground potential with a second terminal.

6. The apparatus according to claim 5, wherein a low voltage on the connection line can be calculated according to $$V_{lo} = \frac{VDDQ_{Rcv} * RTT_{Dn} * RON_{DrvDn} + VSSQ_{Rcv} * RTT_{Up} * RON_{DrvDn} + VSSQ_{Drv} * RTT_{Up} * RTT_{Dn}}{RTT_{Dn} * RON_{DrvDn} + RTT_{Up} * RON_{DrvDn} + RTT_{Up} * RTT_{Dn}}$$

where $V_{lo}$ relates to the low voltage, $VDDQ_{Rcv}$ relates to the second supply voltage, $VSSQ_{Drv}$=$VSSQ_{Rcv}$ relates to the ground potential, $RON_{DrvDn}$ relates to the resistance of the second resistive element, $RTT_{Up}$ relates to the resistance of a third resistive element between the connection line and the second supply voltage in the receiver network and $RTT_{Dn}$ relates to the resistance of a fourth resistive element between the connection line and the ground potential in the receiver network.

7. The apparatus according to claim 5, wherein a high voltage on the connection line can be calculated according to $$V_{hi} = \frac{VDDQ_{Rcv} * RTT_{Dn} * RON_{DrvUp} + VSSQ_{Rcv} * RTT_{Up} * RON_{DrvUp} + VDDQ_{Drv} * RTT_{Up} * RTT_{Dn}}{RTT_{Dn} * RON_{DrvUp} + RTT_{Up} * RON_{DrvUp} + RTT_{Up} * RTT_{Dn}}$$

where $V_{hi}$ relates to the high voltage, $VDDQ_{Drv}$ relates to the first supply voltage, $VDDQ_{Rcv}$ relates to the second supply voltage, $VSSQ_{Rcv}$ relates to the ground potential, $RON_{DrvUp}$ relates to the resistance of the first resistive element, $RTT_{Up}$ relates to the resistance of a third resistive element between the connection line and the second supply voltage in the receiver network and $RTT_{Dn}$ relates to the resistance of a fourth resistive element between the connection line and the ground potential in the receiver network.

8. The apparatus according to claim 5, wherein the first supply voltage is smaller than the second supply voltage, the resistance of the first resistive element equals the resistance of the second resistive element within a range of 10% of the first resistance and the receiving network is designed such that a third resistance between the connection line and the second supply voltage is smaller than a fourth resistance between the connection line and the ground potential.

9. The apparatus according to claim 8, wherein the first supply voltage lies within a range of 20% of 1.2 Volts, the second supply voltage lies within a range of 20% of 1.8 Volts, the first resistance lies within a range of 50% of 20 Ohms and the third resistance lies within a range of 20% of 60 Ohms.

10. The apparatus according to claim 5, wherein the first supply voltage is larger than the second supply voltage, the resistance of the first resistive element equals the resistance of the second resistive element within a range of 10% of the resistance of the first resistive element and the receiving network is designed such that a third resistance between the connection line and the second supply voltage is larger than a fourth resistance between the connection line and the ground potential.

11. The apparatus according to claim 10, wherein the first supply voltage lies within a range of 20% of 1.8 Volts, the second supply voltage lies within a range of 20% of 1.2 Volts, the first resistance lies within a range of 50% of 20 Ohms and the fourth resistance lies within a range of 20% of 48 Ohms.

12. The apparatus according to claim 5, wherein the first supply voltage is smaller than the second supply voltage, the resistance of the first resistive element is larger than the resistance of the second resistive element and the receiving network is designed such that a third resistance between the connection line and the second supply voltage is smaller than a fourth resistance between the connection line and the ground potential.

13. The apparatus according to claim 12, wherein the first supply voltage is in a range of 20% of 1.2 Volts, the second supply voltage lies within a range of 20% of 1.8 Volts, the first resistance lies within a range of 20% of 44 Ohms, the second resistance lies within a range of 20% of 20 Ohms and the third resistance lies within a range of 20% of 75 Ohms.

14. The apparatus according to claim 5, wherein the first supply voltage is larger than the second supply voltage, the resistance of the first resistive element is larger than the resistance of the second resistive element and the receiving network is designed such that a third resistance between the connection line and the second supply voltage is larger than a fourth resistance between the connection line and the ground potential.

15. The apparatus according to claim 14, wherein the first supply voltage lies within a range of 20% of 1.8 Volts, the second supply voltage lies within a range of 20% of 1.2 Volts, the first resistance lies within a range of 20% of 25 Ohms, the second resistance lies within a range of 20% of 20 Ohms and the fourth resistance lies within a range of 20% of 50 Ohms.

16. A system comprising:
a first circuit having a first voltage supply for supplying a first supply voltage;
a second circuit having a second voltage supply for supplying a second supply voltage being different from the first supply voltage; and
an interface interfacing the first circuit and the second circuit, the interface comprising:
a driver circuit having a driver network comprising resistive elements and driver supply voltage terminals connected to controllable switches;
a receiver circuit having a receiving network comprising a resistive element and receiver supply voltage terminals;
a connection line connecting the driver circuit and the receiver circuit, wherein the controllable switches have two switch configurations, a first switch configuration resulting in a high voltage on the connection line and a second switch configuration resulting in a low voltage on the connection line, wherein the resistive elements in the driver network and the receiver network are designed to have values so that a sum of the high voltage and the low voltage is equal to the second supply voltage within a range of 10% of the second supply voltage when the first supply voltage is applied to the driver supply voltage terminals and when the second supply voltage is applied to the receiver supply voltage terminals.

17. The system according to claim 16, wherein the first circuit corresponds to a memory chip, the second circuit corresponds to a memory controller chip or memory buffer chip and the interface corresponds to a memory interface between the memory chip and the memory controller chip or memory buffer chip.

18. A method for interfacing a first circuit using a first supply voltage and a second circuit using a second supply voltage different from the first supply voltage, the method comprising:

switching controllable switches in a driver circuit having a driver network comprising driver supply voltage terminals connected to controllable switches, the controllable switches comprising resistive elements or being separated from resistive elements, the switches having two switch configurations, a first switch configuration resulting in a high voltage on a connection line connecting the driver circuit and a receiver circuit having a receiver network comprising a resistive element and receiver supply voltage terminals, and a second switch configuration resulting in a low voltage on the connection line, wherein resistive elements in the driver network and the receiver network are designed to have values so that a sum of the high voltage and the low voltage is equal to the second supply voltage within a range of 10% of the second supply voltage when the first supply voltage is applied to the driver supply voltage terminals and when the second supply voltage is applied to the second supply voltage terminals.

19. The method according to claim 18, wherein the step of switching controllable switches comprises a step of forming a resistive element of the driver network and/or the receiver network a controllable switch by a transistor, when a value of the resistive element is an ON-resistance of the transistor.

20. The method according to claim 18, wherein the step of switching controllable switches comprises a step of forming the resistive elements of the driver network and/or the receiver network by resistors.

21. The method according to claim 18, wherein the step of switching controllable switches comprises a step of forming the controllable switches by transistors, wherein controlling terminals of the transistors are being controlled on the basis of a data signal to be transmitted towards the receiver circuit and a data enabling signal enabling a transmission of the data signal.

22. The method according to claim 18, wherein the step of switching controllable switches comprises a step of connecting a first resistive element between the connection line and a first terminal of a first controllable switch, the switch being connected to the first supply voltage with a second terminal, and a step of connecting a second resistive element between the connection line and a first terminal of a second controllable switch, the second switch being connected to a ground potential with a second terminal.

23. The method according to claim 22, wherein a low voltage on the connection line can be calculated according to $$V_{lo} = \frac{VDDQ_{Rcv} * RTT_{Dn} * RON_{DrvDn} + VSSQ_{Rcv} * RTT_{Up} * RON_{DrvDn} + VSSQ_{Drv} * RTT_{Up} * RTT_{Dn}}{RTT_{Dn} * RON_{DrvDn} + RTT_{Up} * RON_{DrvDn} + RTT_{Up} * RTT_{Dn}}$$

where $V_{lo}$ relates to the low voltage, $VDDQ_{Rcv}$ relates to the second supply voltage, $VSSQ_{Drv}$=$VSSQ_{Rcv}$ relates to the ground potential, $RON_{DrvDn}$ relates to the resistance of the second resistive element, $RTT_{Up}$ relates to the resistance of a third resistive element between the connection line and the second supply voltage in the receiver network and $RTT_{Dn}$ relates to the resistance of a fourth resistive element between the connection line and the ground potential in the receiver network.

24. The method according to claim 22, wherein a high voltage on the connection line can be calculated according to $$V_{hi} = \frac{VDDQ_{Rcv} * RTT_{Dn} * RON_{DrvUp} + VSSQ_{Rcv} * RTT_{Up} * RON_{DrvUp} + VDDQ_{Drv} * RTT_{Up} * RTT_{Dn}}{RTT_{Dn} * RON_{DrvUp} + RTT_{Up} * RON_{DrvUp} + RTT_{Up} * RTT_{Dn}}$$

where $V_{hi}$ relates to the high voltage, $VDDQ_{Drv}$ relates to the first supply voltage, $VDDQ_{Rcv}$ relates to the second supply voltage, $VSSQ_{Rcv}$ relates to the ground potential, $RON_{DrvUp}$ relates to the resistance of the first resistive element, $RTT_{Up}$ relates to the resistance of a third resistive element between the connection line and the second supply voltage in the receiver network and $RTT_{Dn}$ relates to the resistance of a fourth resistive element between the connection line and the ground potential in the receiver network.

25. The method according to claim 22, wherein the first supply voltage is smaller than the second supply voltage, the resistance of the first resistive element equals the resistance of the second resistive element within a range of 10% of the first resistance and the receiving network is designed such that a third resistance between the connection line and the second supply voltage is smaller than a fourth resistance between the connection line and the ground potential.

26. The method according to claim 25, wherein the first supply voltage lies within a range of 20% of 1.2 Volts, the second supply voltage lies within a range of 20% of 1.8 Volts, the first resistance lies within a range of 50% of 20 Ohms and the third resistance lies within a range of 20% of 60 Ohms.

27. The method according to claim 22, wherein the first supply voltage is larger than the second supply voltage, the resistance of the first resistive element equals the resistance of the second resistive element within a range of 10% of the resistance of the first resistive element and the receiving network is designed such that a third resistance between the connection line and the second supply voltage is larger than a fourth resistance between the connection line and the ground potential.

28. The method according to claim 27, wherein the first supply voltage lies within a range of 20% of 1.8 Volts, the second supply voltage lies within a range of 20% of 1.2 Volts, the first resistance lies within a range of 50% of 20 Ohms and the fourth resistance lies within a range of 20% of 48 Ohms.

29. The method according to claim 22, wherein the first supply voltage is smaller than the second supply voltage, the resistance of the first resistive element is larger than the resistance of the second resistive element and the receiving network is designed such that a third resistance between the connection line and the second supply voltage is smaller than a fourth resistance between the connection line and the ground potential.

30. The method according to claim 29, wherein the first supply voltage is in a range of 20% of 1.2 Volts, the second supply voltage lies within a range of 20% of 1.8 Volts, the first resistance lies within a range of 20% of 44 Ohms, the second resistance lies within a range of 20% of 20 Ohms and the third resistance lies within a range of 20% of 75 Ohms.

31. The method according to claim 22, wherein the first supply voltage is larger than the second supply voltage, the resistance of the first resistive element is larger than the resistance of the second resistive element and the receiving network is designed such that a third resistance between the connection line and the second supply voltage is larger than a fourth resistance between the connection line and the ground potential.

32. The method according to claim 31, wherein the first supply voltage lies within a range of 20% of 1.8 Volts, the second supply voltage lies within a range of 20% of 1.2 Volts, the first resistance lies within a range of 20% of 25 Ohms, the second resistance lies within a range of 20% of 20 Ohms and the fourth resistance lies within a range of 20% of 50 Ohms.

33. A computer program having a program code for performing the method in accordance with claim 18, when the computer program runs on a computer.

* * * * *

UNITED STATES PATENT AND TRADEMARK OFFICE
CERTIFICATE OF CORRECTION

| | |
|---|---|
| PATENT NO. | : 7,405,591 B2 |
| APPLICATION NO. | : 11/641545 |
| DATED | : July 29, 2008 |
| INVENTOR(S) | : Braun et al. |

Page 1 of 1

It is certified that error appears in the above-identified patent and that said Letters Patent is hereby corrected as shown below:

In Col. 11, line 52, delete "$V_{hi}$=1.20V" and insert -- $V_{lo}$=0.00 V--.
In Col. 15, line 33, after "network" insert -- and --.

Signed and Sealed this

Seventh Day of October, 2008

JON W. DUDAS
*Director of the United States Patent and Trademark Office*